United States Patent
Baum et al.

(10) Patent No.: US 8,365,108 B2
(45) Date of Patent: Jan. 29, 2013

(54) GENERATING CUT MASK FOR DOUBLE-PATTERNING PROCESS

(75) Inventors: Zachary Baum, Gardiner, NY (US); Henning Haffner, Pawling, NY (US); Scott M. Mansfield, Hopewell Junction, NY (US)

(73) Assignees: International Business Machines Corporation, Armonk, NY (US); Infineon Technologies North America Corporation, Milpitas, CA (US)

( * ) Notice: Subject to any disclaimer, the term of this patent is extended or adjusted under 35 U.S.C. 154(b) by 93 days.

(21) Appl. No.: 12/985,643

(22) Filed: Jan. 6, 2011

(65) Prior Publication Data

US 2012/0180006 A1    Jul. 12, 2012

(51) Int. Cl.
- *G06F 17/50* (2006.01)
- *G06F 19/00* (2006.01)
- *G03F 1/00* (2006.01)
- *G21K 5/00* (2006.01)
- *G06K 9/00* (2006.01)

(52) U.S. Cl. ............... 716/55; 716/52; 716/53; 716/54; 716/112; 430/5; 700/120; 700/121; 378/35; 382/144; 382/154

(58) Field of Classification Search .............. 716/52, 716/53, 54, 55, 112; 700/120, 121; 430/5; 378/35; 382/144, 154
See application file for complete search history.

(56) References Cited

U.S. PATENT DOCUMENTS

| | | | |
|---|---|---|---|
| 5,424,154 A | 6/1995 | Borodovsky | |
| 5,563,012 A | 10/1996 | Neisser | |
| 6,929,887 B1 | 8/2005 | Lin et al. | |
| 7,266,798 B2 | 9/2007 | Mansfield et al. | |
| 7,376,512 B2 * | 5/2008 | Hirscher et al. | 702/1 |
| 7,784,019 B1 * | 8/2010 | Zach | 716/53 |
| 7,865,866 B2 * | 1/2011 | Kim et al. | 716/50 |
| 8,200,468 B2 * | 6/2012 | Ye et al. | 703/13 |
| 8,204,295 B2 * | 6/2012 | Preil et al. | 382/144 |
| 2004/0013950 A1 * | 1/2004 | Kang et al. | 430/5 |
| 2005/0166174 A1 * | 7/2005 | Ye et al. | 716/20 |
| 2005/0204322 A1 * | 9/2005 | Kotani et al. | 716/10 |
| 2006/0080633 A1 * | 4/2006 | Hsu et al. | 716/19 |
| 2006/0101370 A1 * | 5/2006 | Cui et al. | 716/19 |
| 2008/0069432 A1 * | 3/2008 | Hsu et al. | 382/145 |
| 2008/0183323 A1 * | 7/2008 | Menadeva et al. | 700/109 |
| 2009/0079005 A1 | 3/2009 | Haffner et al. | |
| 2009/0081563 A1 | 3/2009 | Wang et al. | |
| 2010/0010784 A1 * | 1/2010 | Cao et al. | 703/1 |
| 2010/0119143 A1 * | 5/2010 | Preil et al. | 382/144 |
| 2010/0135568 A1 * | 6/2010 | Preil et al. | 382/144 |
| 2010/0162197 A1 * | 6/2010 | Ye et al. | 716/21 |
| 2010/0175040 A1 | 7/2010 | Meiring et al. | |
| 2010/0185999 A1 * | 7/2010 | Graur et al. | 716/20 |
| 2012/0122023 A1 * | 5/2012 | Hsu et al. | 430/5 |

OTHER PUBLICATIONS

Infineon Technologies Internal Invention Disclosure complementing pending application US20090081563.

* cited by examiner

*Primary Examiner* — Phallaka Kik
(74) *Attorney, Agent, or Firm* — Yuanmin Cai; Hoffman Warnick LLC

(57) ABSTRACT

Aspects of the invention include a computer-implemented method of designing a photomask. In one embodiment, the method comprises: simulating a first photomask patterning process using a first photomask design to create simulated contours; comparing the simulated contours to a desired design; identifying regions not common to the simulated contours and the desired design; creating desired target shapes for a second photomask patterning process subsequent to the first photomask patterning process based upon the identified regions; and providing the desired target shapes for forming of a second photomask design based upon the desired target shapes.

24 Claims, 12 Drawing Sheets

GENERATING CUT MASK FOR DOUBLE-PATTERNING PROCESS

BACKGROUND OF THE INVENTION

The subject matter disclosed herein relates to the use of simulation to identify potential non-target (undesirable) patterns in a first patterning step of a double-patterning process, and subsequently using that simulation to guide the creation of the cut mask design to be used in a second patterning step. The cut mask design in the second patterning step is designed to remove any non-target (undesirable) patterns.

As integrated circuits (ICs) continue to reduce in size due to technological advances, so too do the ground rules governing designs of these ICs. In some cases, these shrinking ground rules make designing and forming of features in a single mask level unrealistic. Accordingly, double exposure or double patterning techniques have been developed to allow for formation of features according to smaller ground rules. However, conventional rules-based double exposure/double patterning techniques may still fail to properly forecast problems in the masking and exposure processes.

BRIEF SUMMARY OF THE INVENTION

Solutions for designing a photomask are disclosed. In one embodiment, a computer-implemented method of designing a photomask is disclosed, the method comprising: simulating a first photomask patterning process using a first photomask design to create simulated contours; comparing the simulated contours to a desired design; identifying regions not common to the simulated contours and the desired design; creating desired target shapes for a second photomask patterning process subsequent to the first photomask patterning process based upon the identified regions; and providing the desired target shapes for forming of a second photomask design based upon the desired target shapes.

A first aspect of the disclosure includes a computer-implemented method of designing a photomask, the method comprising: simulating a first photomask patterning process using a first photomask design to create simulated contours; comparing the simulated contours to a desired design; identifying regions not common to the simulated contours and the desired design; creating desired target shapes for a second photomask patterning process subsequent to the first photomask patterning process based upon the identified regions; and providing the desired target shapes for forming of a second photomask design based upon the desired target shapes.

A second aspect of the disclosure includes a computer system comprising: at least one computing device configured to design a photomask by performing actions comprising: simulating a first photomask patterning process using a first photomask design to create simulated contours; comparing the simulated contours to a desired design; identifying regions not common to the simulated contours and the desired design; creating desired target shapes for a second photomask patterning process subsequent to the first photomask patterning process based upon the identified regions; and providing the desired target shapes for forming of a second photomask design based upon the desired target shapes.

A third aspect of the disclosure includes a computer program comprising program code embodied in at least one computer-readable storage medium, which when executed, enables a computer system to implement a method for designing a photomask, the method comprising: simulating a first photomask patterning process using a first photomask design to create simulated contours; comparing the simulated contours to a desired design; identifying regions not common to the simulated contours and the desired design; creating desired target shapes for a second photomask patterning process subsequent to the first photomask patterning process based upon the identified regions; and providing the desired target shapes for forming of a second photomask design based upon the desired target shapes.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
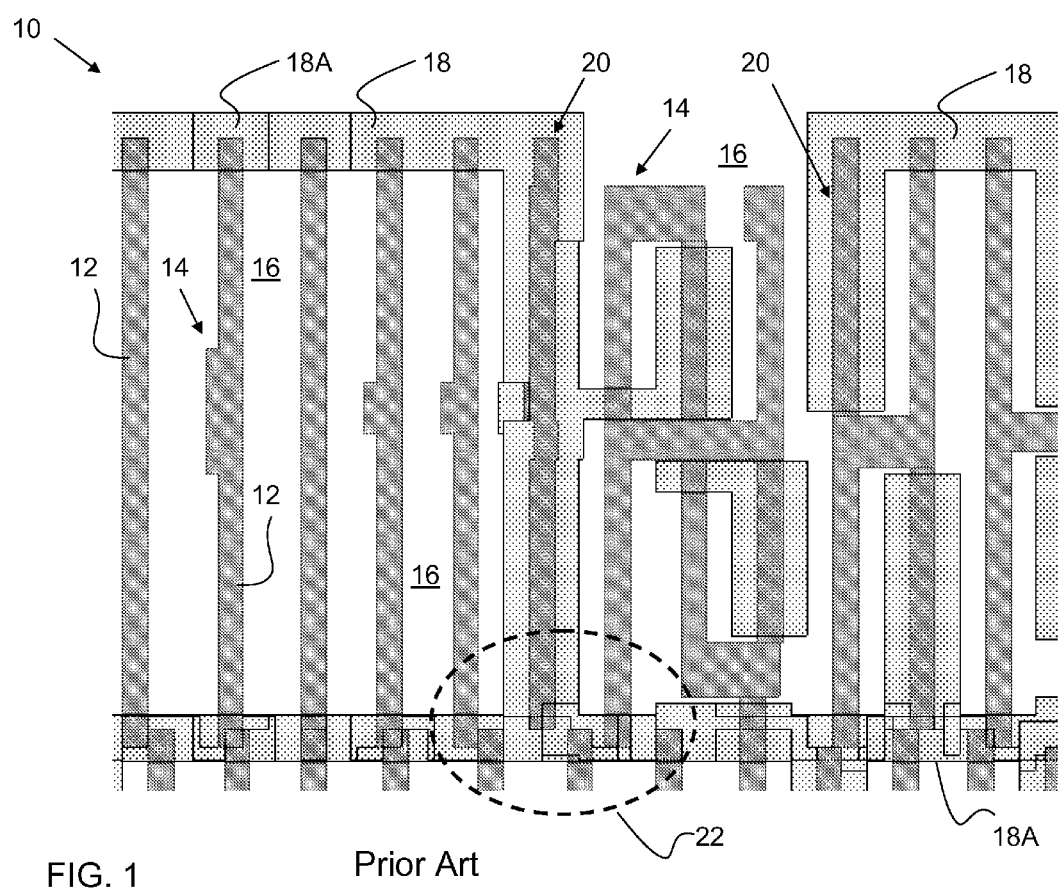
FIG. 1 shows an illustrative layout view of a portion of an integrated circuit (IC) according to the prior art.

As integrated circuits (ICs) continue to reduce in size due to technological advances, so too do the ground rules governing designs of these ICs. In some cases, these shrinking ground rules make designing and forming of features in a single mask level unrealistic. Accordingly, double exposure or double patterning techniques have been developed to allow for formation of features according to smaller ground rules. The intent of these double exposure or double patterning techniques is to decompose the IC design into two masks, where each of the two masks requires either a less aggressive and/or more precise exposure (illumination) scheme than in a single mask configuration.

As an example of a conventional double-patterning approach, an initial design (target) for the IC is formed on the wafer (via, e.g., deposition, exposure, and/or etching) in a pattern including extra, or superfluous, features. Subsequently, a second patterning process is used to remove the extra features and form the target design (designers' intent). As indicated, the extra features may help improve the first patterning step, and the second patterning process may use a removal or "cut" mask to eliminate those extra features. The target design is used to help create the mask patterns for each of the first and second processes, thereby cumulatively reaching the target design. This rules-based approach has shortcomings, namely, its inability to determine exactly what undesired features will print in the first photomask patterning process.

In contrast to conventional approaches, aspects of the invention involve using a simulation to identify non-target (or, undesirable) patterns in the first patterning step of a double-patterning process, and using that simulation to create a cut mask design to be used in the subsequent (second) patterning step. This cut mask design will be used to remove non-target patterns in the IC. It is understood that the processes described herein may not necessarily be performed in the order recited, and that in some embodiments, the processes described herein may be performed at different locations and/or by different entities. Further, it is understood that the teachings described according to embodiments herein may be applied to processes involving more than two patterning steps.

It is understood that aspects of the invention are not necessarily aimed at creation of the mask layer for the first exposure/patterning step. However, aspects of the invention include using the first mask layer to simulate the first patterning process. For example, in one embodiment, simulation of the first patterning process may be performed at nominal process conditions, thereby generating a nominal process contour of the first layout design mask pattern.

In another embodiment, simulation of the first patterning process may be performed using various process conditions, thereby simulating a band of contours (or, process variation band) representing a range of edge locations that may be printed according to process variations. Examples of process variations in the lithographic exposure process that may be considered in this embodiment include: a) exposure dose; b) exposure focus; c) mask dimension errors; d) intra-mask placement errors; e) alignment errors, and others.

In either case, a target layer for the second exposure process can be created by comparing either the nominal contour or the band of contours to the desired final target. In one embodiment, the second exposure target is determined as the regions where the nominal contour for the first exposure is not located over the final target. In another embodiment, the second exposure target is determined as the regions where the band of contours for the first exposure is not located over the final target. In either embodiment, edge tolerances of the final target may be accounted for through a global biasing of the final target.

Alternatively, tolerance bands for the second exposure can be formed. In this case, the band of contours for the first exposure can be compared to the tolerance bands for the final target to identify regions where contours fall outside the first tolerance bands. These regions are used to create the second exposure tolerance bands. The second exposure tolerance band represents the valid range of edge locations for the second exposure.

Following creation of the second exposure target, second exposure tolerance band, or both, conventional techniques such as resolution enhancement techniques (RET) and optical proximity correction (OPC) (possibly in both forward and inverse mode) may be used to create the cut mask design.

The result, when compared with conventional techniques, is an improved cut mask design that provides robust removal of extraneous (or, undesired) features added to the first exposure's mask layout. It is understood that as used herein, the terms "extraneous features" and "undesired features" may be used interchangeably to describe features produced in a layout (e.g., due to printing) that are not desirable in the final layout, and also violate certain dimensional constraints (e.g., tolerances). In some cases, these extraneous features may be identified during simulation, prior to formation of a cut mask. In some cases, these extraneous features may exist at the outer contour of a process variation band (e.g., those outermost process variations). In some cases, these extraneous features may exist due to exposure variations and/or interfering light waveforms (e.g., via constructive interference) that create undesired features (e.g., features) on an underlying target. The cut mask may then be designed in order to remove these extraneous features from the final layout.

Distinct from the extraneous features, as used herein, the term "additional features" refers to those features intentionally added to a layout during a first processing step (e.g., printing) to assist in the printing of desired features. These "additional features" may also be known as "printing assist features" or "PrAFs" in the art. It is understood that the conventional approaches include adding these "additional features" or "PrAFs" into a first processing step to aid in the printing of desired features. However, as described herein, conventional approaches do not identify and provide a mechanism for removing the extraneous features from the final layout, and in some cases, conventional approaches fail to identify and remove additional features under process variation conditions.

Turning to FIG. 1, an illustrative layout view of a portion of an integrated circuit (IC) 10 is shown between steps in a double-patterning process according to the prior art. In this view, IC 10 includes a plurality of intended lines 12, which include one or more features 14 to be printed on a substrate 16. Also shown in this view of IC 10 are extraneous features 20, which will be removed using a cut mask 18, which may be formed as a combination of sections 18A. A section 22 of the IC 10 is shown in a phantom circle, and will be further discussed with reference to FIG. 2.

Figure 2:
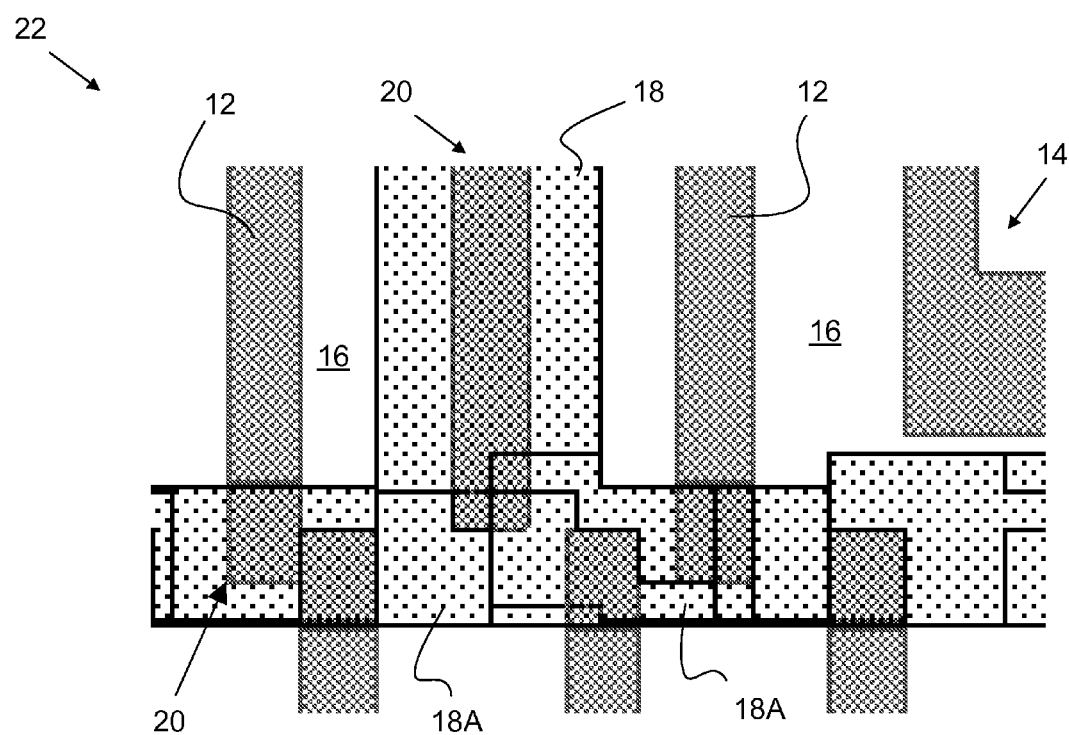
FIG. 2 shows an enhanced view of a portion of the IC shown in FIG. 1 according to the prior art.

Turning to FIG. 2, an enhanced view of the section 22 of IC 10 is shown for illustrative purposes. As is shown in greater detail in FIG. 2, cut mask 18 may be formed of a plurality of sections 18A, which may conventionally take the shape of polygons. According to the prior art, said cut mask 18 consists of sections 18A, such that a group of design rules is obeyed. However, these design rules do not take into account the process variations that occur during actual printing of lines 12 (and features 14), and therefore, may cause ineffective removal of extraneous features 20, as will be illustrated in FIG. 3.

Figure 3:
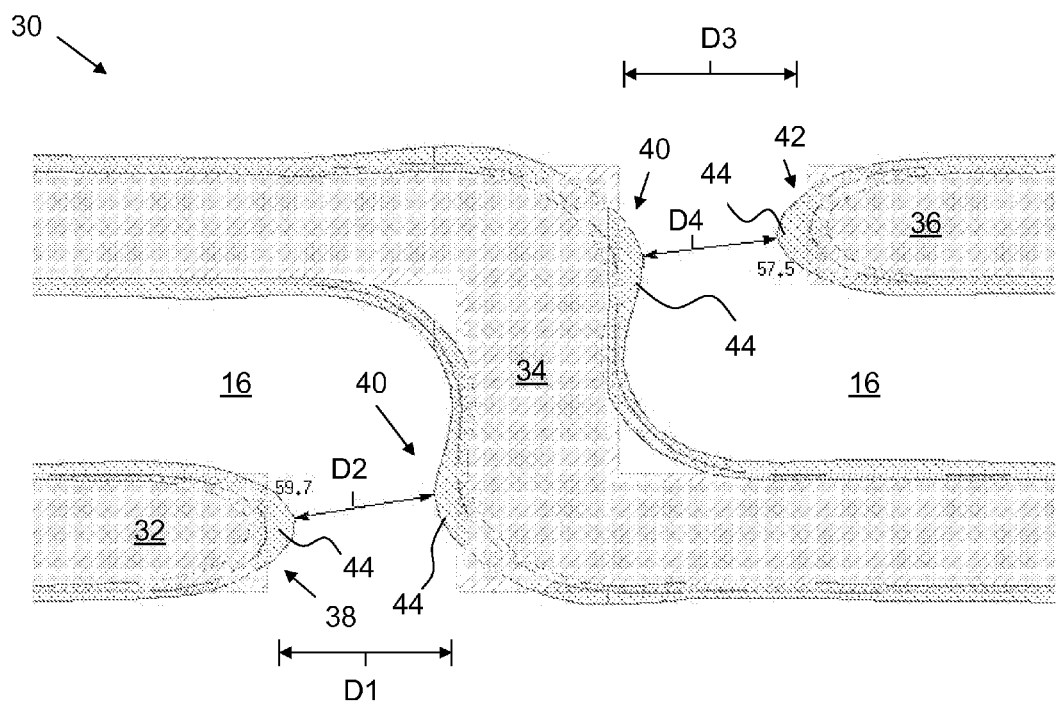
FIG. 3 shows an illustrative layout view of a process variation plot for an IC after simulation of a first patterning process according to embodiments.

Turning to FIG. 3, an illustrative layout view of a portion of an integrated circuit (IC) 30 is shown after simulation of a first patterning (and masking) process. This portion of IC 30 illustrates how process variation affects the simulation of contours. In particular, this portion of IC 30 may illustrate how worst-case process variation simulations (e.g., outer process variation-bands) violate minimum space constraints. As shown, this portion of IC 30 may include a first line 32, a second line 34, and a third line 36 formed over a substrate 16. As shown, non-uniformity exists in the spacing between first line 32 and second line 34, and second line 34 and third line 36, due to errors in printing edges 38 of first line 32, edges 40 of second line 34, and edges 42 of third line 36. As shown, first line 32 and second line 34 were designed to be printed at a distance D1 (e.g., 70 nanometers) from one another, while actual printing of first line 32 and second line 34 may result in printing of extraneous (non-design) features 44, causing the actual distance D2 (e.g., 59.7 nanometers) between edges 38 and 40, respectively, to be smaller than the designed distance D1. Also shown, second line 34 and third line 36 were designed to be printed at a distance D3 (e.g., 70 nanometers)

from one another, while actual printing of second line 34 and third line 36 may result in printing of extraneous (non-design) features 44, causing the actual distance D4 (e.g., 57.5 nanometers) between edges 40 and 42, respectively, to be smaller than the designed distance D1. In embodiments of the current invention, extraneous features 44 may be removed from IC 30 by forming a cut mask (similar to cut mask 18 of FIGS. 1-2) using the simulated contours of the first patterning process. That is, aspects of the invention provide for the simulation of a first patterning process in an IC (e.g., as with IC 30 of FIG. 3), and subsequent designing of a second mask (or, cut mask) to remove the simulated extraneous features (e.g., extraneous features 44) in the IC.

With continuing reference to FIG. 3, it is understood that the conventional approach to performing a double-patterning process with IC 30 would involve forming a second mask (or, cut mask) that would not remove extraneous features 44. That is, the design (or, target) shapes of first line 32, second line 34 and third line 36 would not include extraneous features 44 (and the associated edges 38, 40 and 42, respectively). Therefore, using the rules-based conventional approach, the design shapes of first line 32, second line 34 and third line 36 would act as the input parameters for designing a subsequent cut mask to remove unwanted features. However, as the design shape of first line 32, second line 34 and third line 36 do not account for process variations (e.g., creation of the extraneous features 44), the subsequent cut mask formed from the design shape will not allow for removal of the extraneous features 44. It is understood that in practice, extraneous features 44 may not be completely removed where process variations are simulated, and that "removal" of these extraneous features 44 includes reducing these features to below a dimensional threshold (or, tolerance). However, as described herein, without accounting for these extraneous features 44, conventional approaches have failed to reduce the extraneous features 44 to below their respective dimensional thresholds. In contrast to these conventional approaches, aspects described herein account for these extraneous features 44 and design a cut mask to remove those features (at least below the dimensional threshold).

Figure 4:
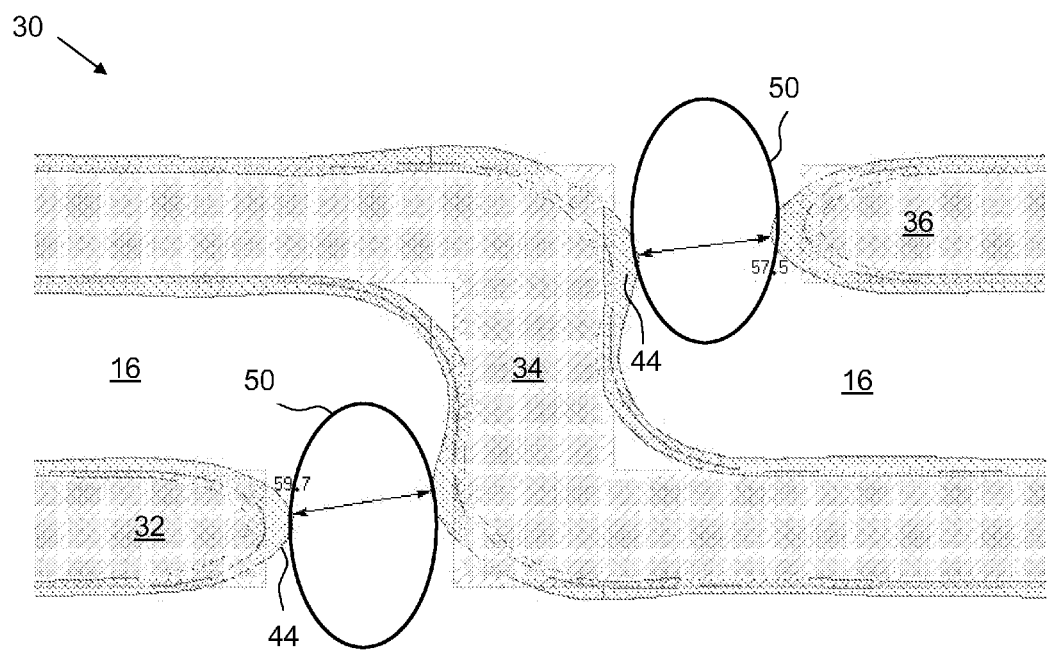
FIG. 4 shows the illustrative layout view of the process variation plot for an IC of FIG. 3, further including an example of nominal contour shapes for a second patterning process according to embodiments.

FIG. 4 shows the illustrative layout view of a portion of the simulated integrated circuit (IC) 30 of FIG. 3, further including second exposure print image contours 50 (generated based upon process variation conditions), formed according to embodiments of the invention. These print image contours 50 may be generated based upon the size of one or more extraneous features 44, or the minimum allowable distance in between those extraneous features 44, in order to determine what a subsequently formed cut mask should look like for removing the portions of extraneous features 44 to meet one or more dimensional thresholds.

Figure 5:
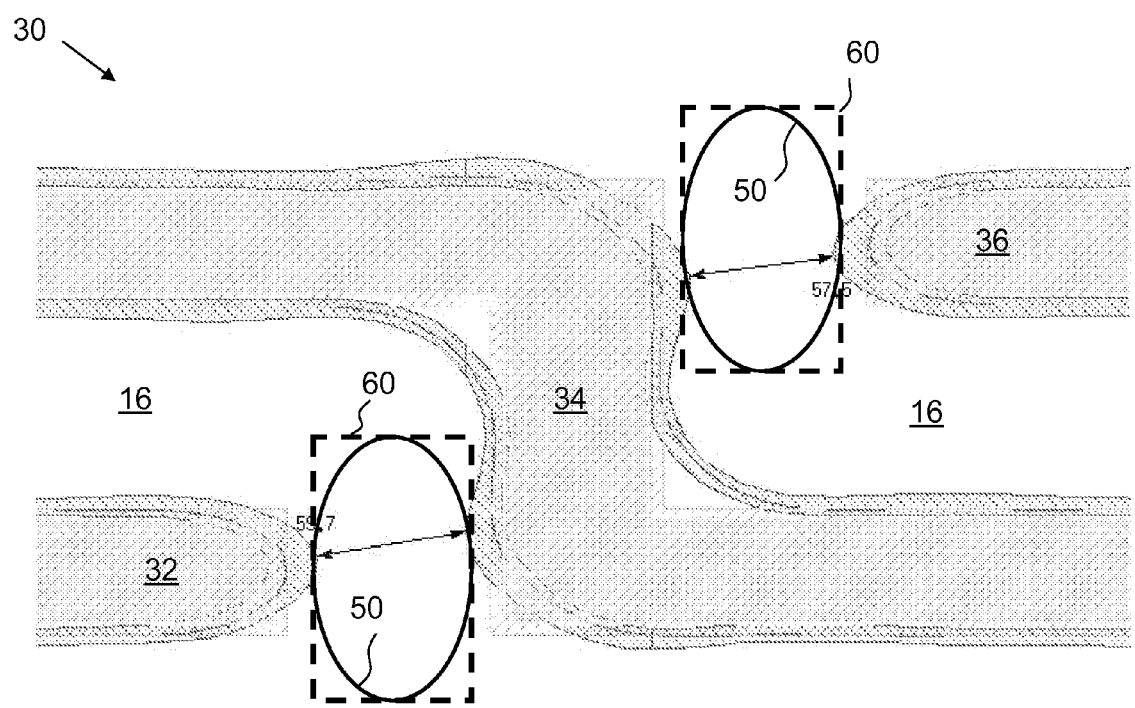
FIG. 5 shows the illustrative layout view of the process variation plot for an IC of FIG. 4, further including an example of a mask layout created using nominal contour shapes according to embodiments.
Figure 6:
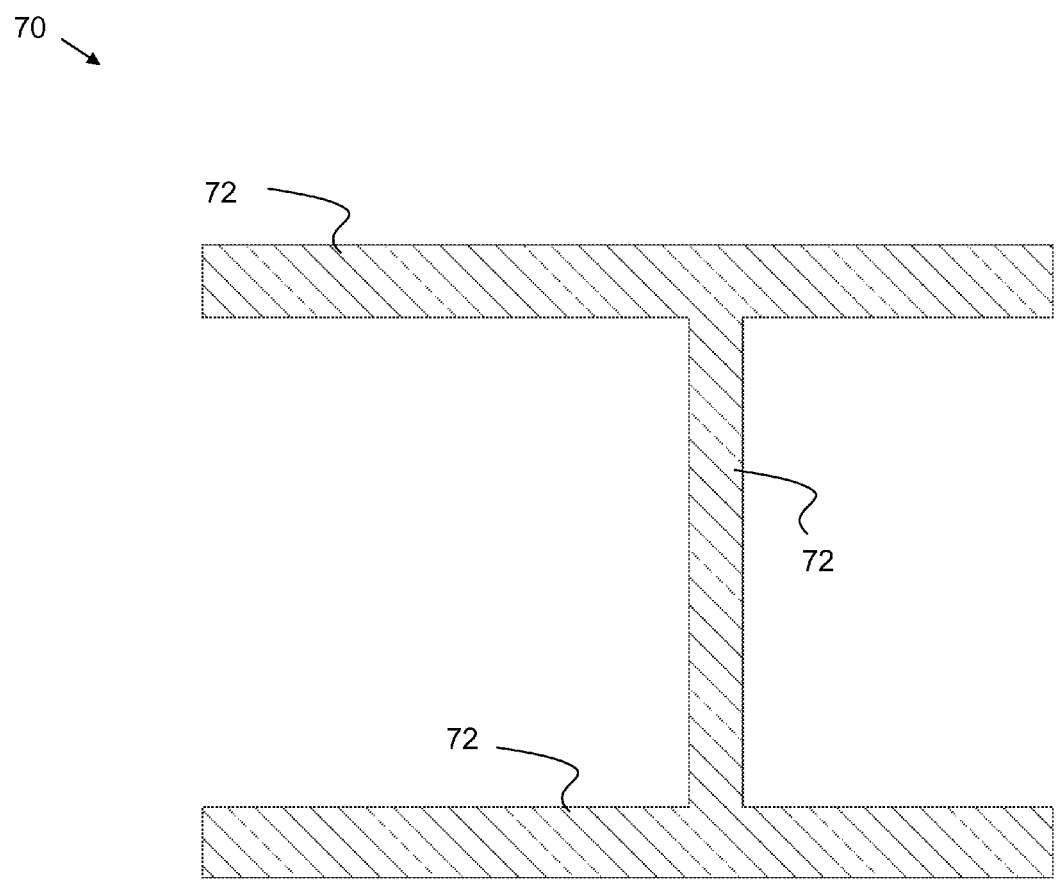
FIGS. 6-10 show illustrative layout views of process variation plots according to embodiments.

FIG. 5 shows the illustrative layout view of a portion of the simulated integrated circuit (IC) 30 of FIG. 4, further including second exposure cut mask design shapes 60. It is understood that these second exposure cut mask design shapes 60 have not yet undergone optical proximity correction (OPC), and are therefore represented by "pre-OPC" data. The second exposure cut mask design shapes 60 are generated based upon the print image contours 50 (which were generated based upon process variations) shown and described with reference to FIG. 4, where the design shapes 60 account for the process variation conditions used to form lines 32, 34, 36. In contrast to conventional approaches, aspects of the invention include forming the second exposure cut mask design shapes 60 based upon print image contours 50 that are determined by the location and sizes of extraneous features 44.

It is understood that as described herein, aspects of the disclosure provide for a method, a system and a program product capable of performing one or more of the following: 1) Identifying and providing for removal of additional features (e.g., PrAFs) in a cut mask process step; 2) Identifying and providing for removal of extraneous features (or potentially additional features) from a first exposure step that occur between target shapes of the first exposure, where those target shapes may be design features, additional features, or a combination of design features and additional features. It is understood that this aspect may include identifying and removing extraneous features of any kind (and in any location), e.g., features such as islands that are predicted to print, due to, for example, optical interference and/or sub-resolution assist features (SRAFs); and 3) Identifying and providing for removal of features (e.g., extraneous features) that violate spacing constraints (e.g., spacing between adjacent lines or features). While described in conjunction with examples included herein, it is understood that these aspects of the disclosure may apply to a variety of integrated circuit structures (and features therein) not specifically described.

In FIGS. 6-10, another illustrative example of aspects of the invention will be described with reference to a portion of an IC. It is understood that these figures are intended to merely convey aspects of the invention, and are in no way limiting of the teachings herein. Turning to FIG. 4, an illustrative layout view of a desired design (according to designer's intent) of a portion 70 of an integrated circuit (IC) is shown. As shown in FIG. 4, this portion 70 of the desired design may include a plurality of lines 72. As will be described further herein, aspects of the invention include accounting for process variations in forming these lines (e.g., lines 72), and subsequently forming one or more cut mask designs based upon those process variations.

Figure 7:
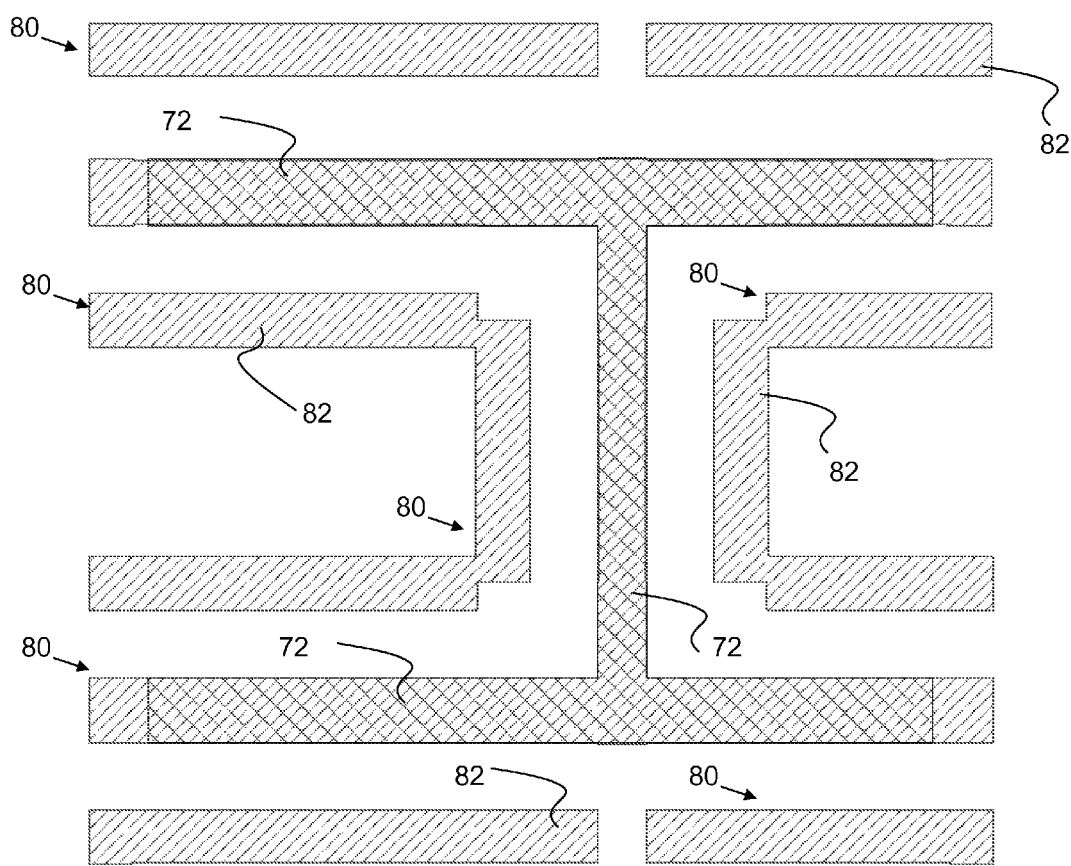

FIG. 7 shows a first mask 80 overlaying the plurality of lines 72, where the first mask 80 includes additional features 82 generated to improve subsequent patterning/exposure processes. That is, as is known in the art, first mask 80 may be created with features designed to cover the plurality of lines 72, as well as additional features 82, intended to be subsequently removed, but also useful in improving the accuracy of subsequent pattering/exposure processes.

Figure 8:
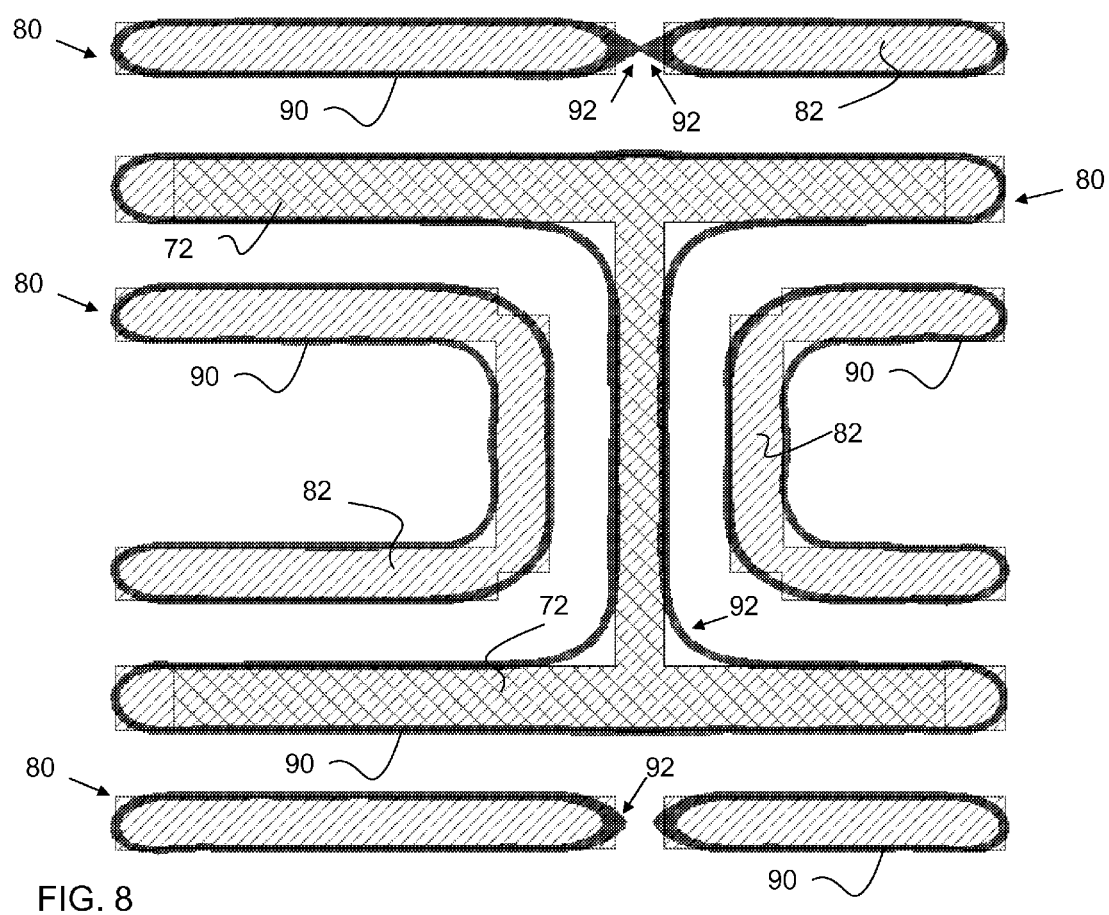

FIG. 8 illustrates a plurality of shapes (e.g., lines) 90 generated through simulation according to predetermined process conditions (e.g., dose, focus, exposure). In some circumstances, the shapes 90 are substantially compliant with the first mask (and thus, the desired design 72) within a predetermined tolerance. However, in some cases, shapes 90 include extraneous features 92, formed in some cases, due to process variations. In embodiments of the invention, these extraneous features 92 are accounted for via simulation, e.g., the simulation of FIG. 8, and used in creating a cut mask.

Figure 9:
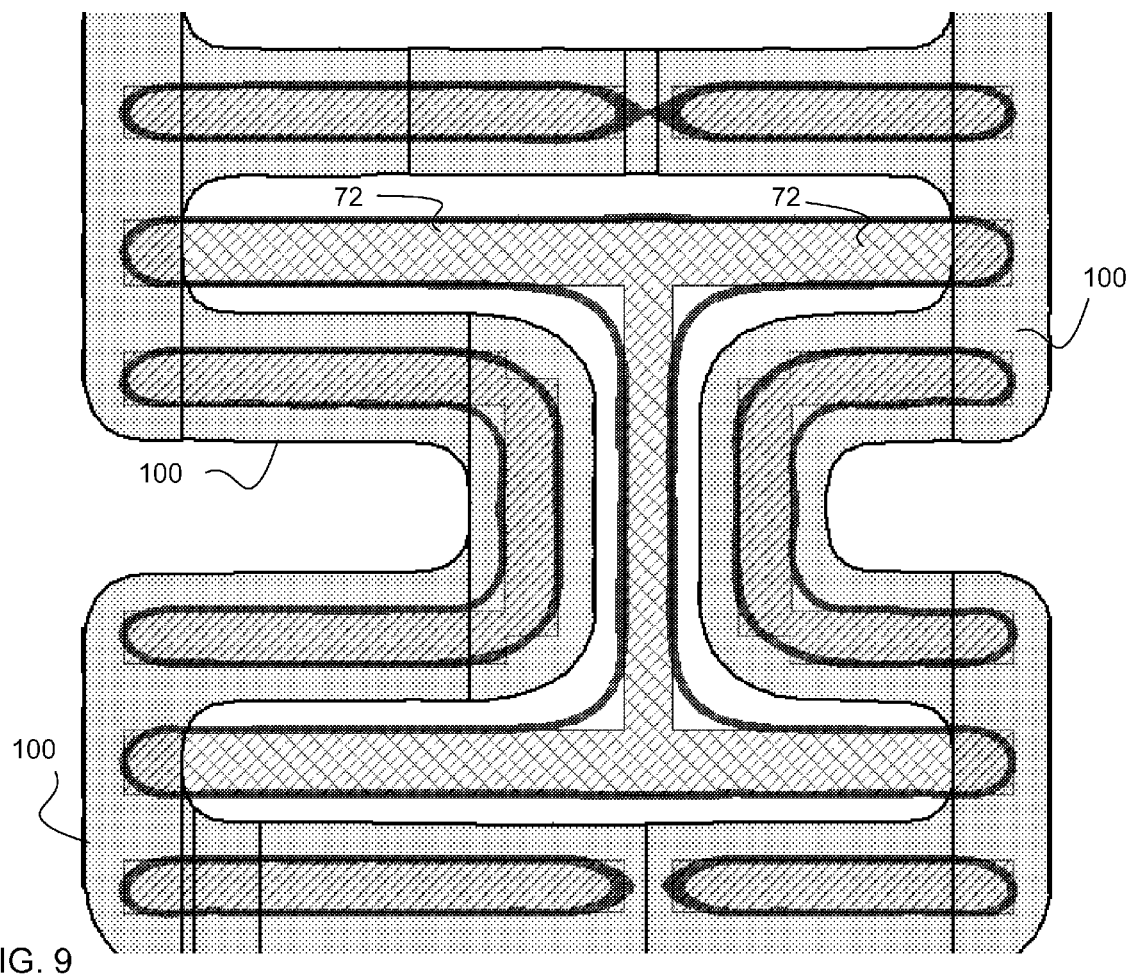

Turning to FIG. 9, formation of a cut mask 100 over some or all of the additional features 82 of mask 80 and extraneous features 92 shown and described with reference to FIG. 8. In this embodiment, cut mask 100 design allows for removal of the extraneous features 92 in order to form the desired design 72.

Figure 10:
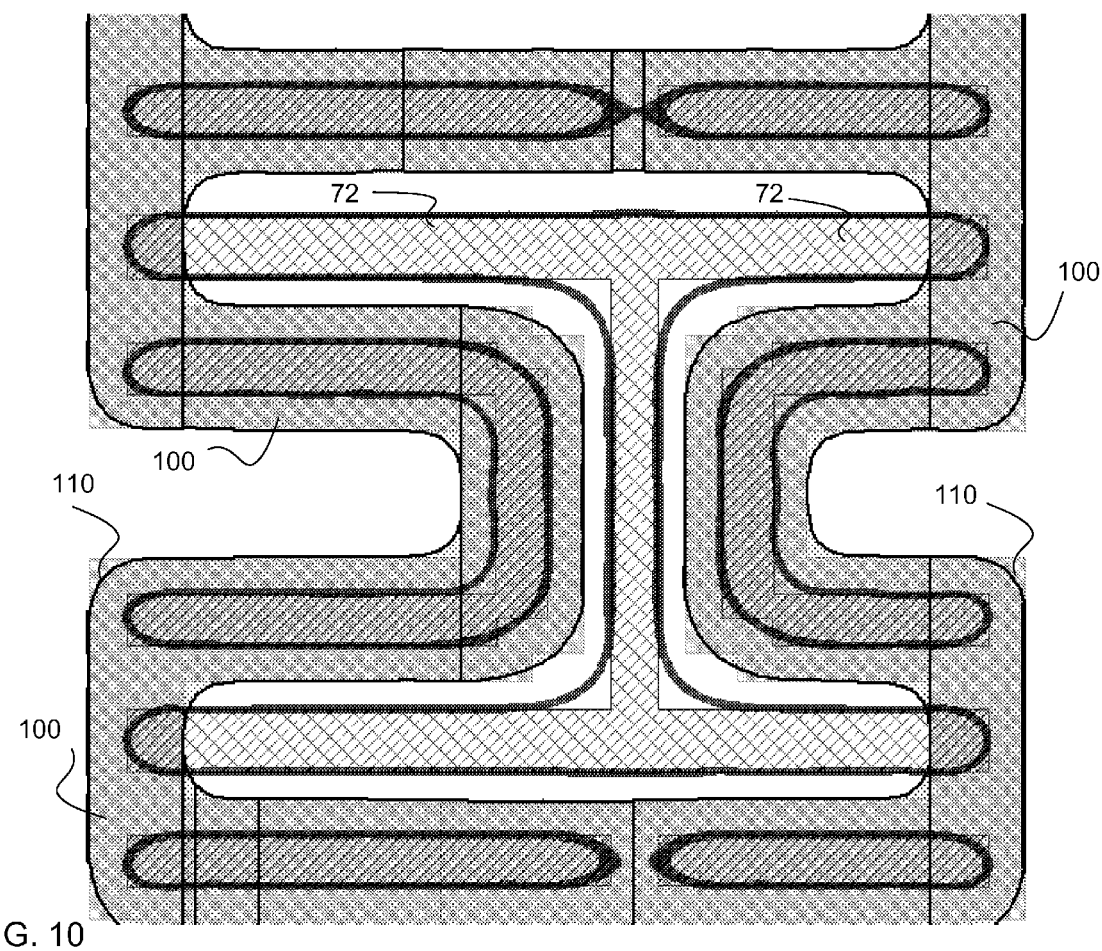

FIG. 10 illustrates transformation of the cut mask 100 of FIG. 9 after optical proximity correction (OPC) is performed to account for exposure variations. As shown, and OPC cut mask 110 includes additional features generated to compensate for exposure discrepancies. As shown, OPC cut mask 110 may be formed according to conventional techniques, and therefore, further description is omitted herein.

Figure 11:
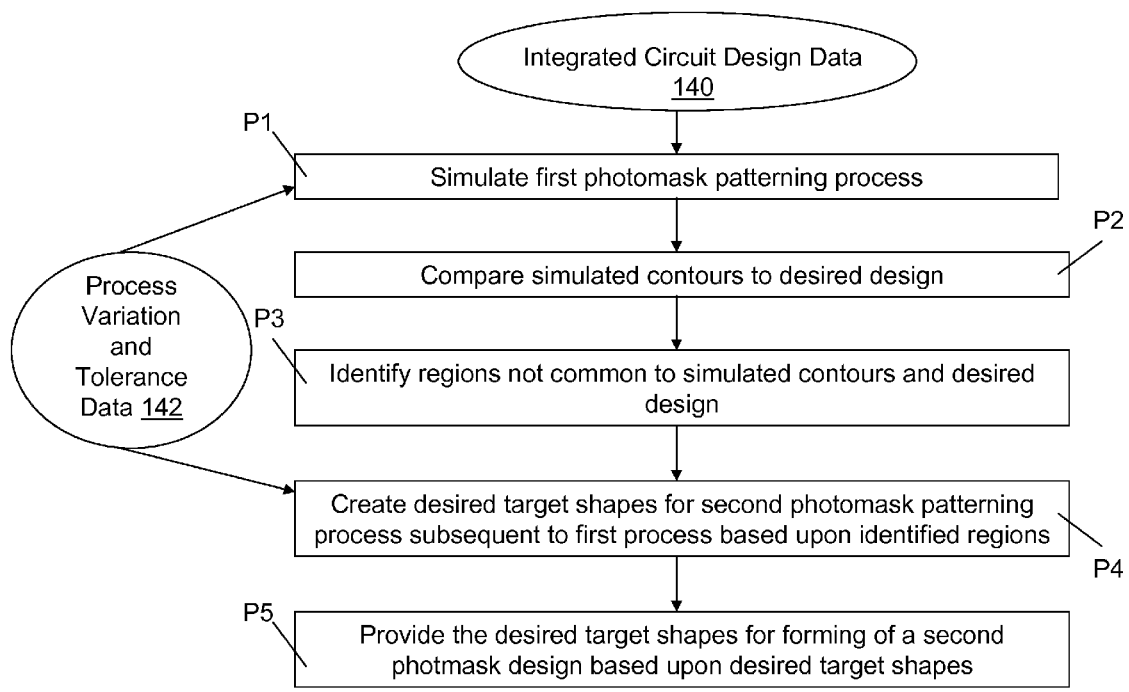
FIG. 11 shows a flow diagram illustrating a method according to embodiments.
Figure 12:
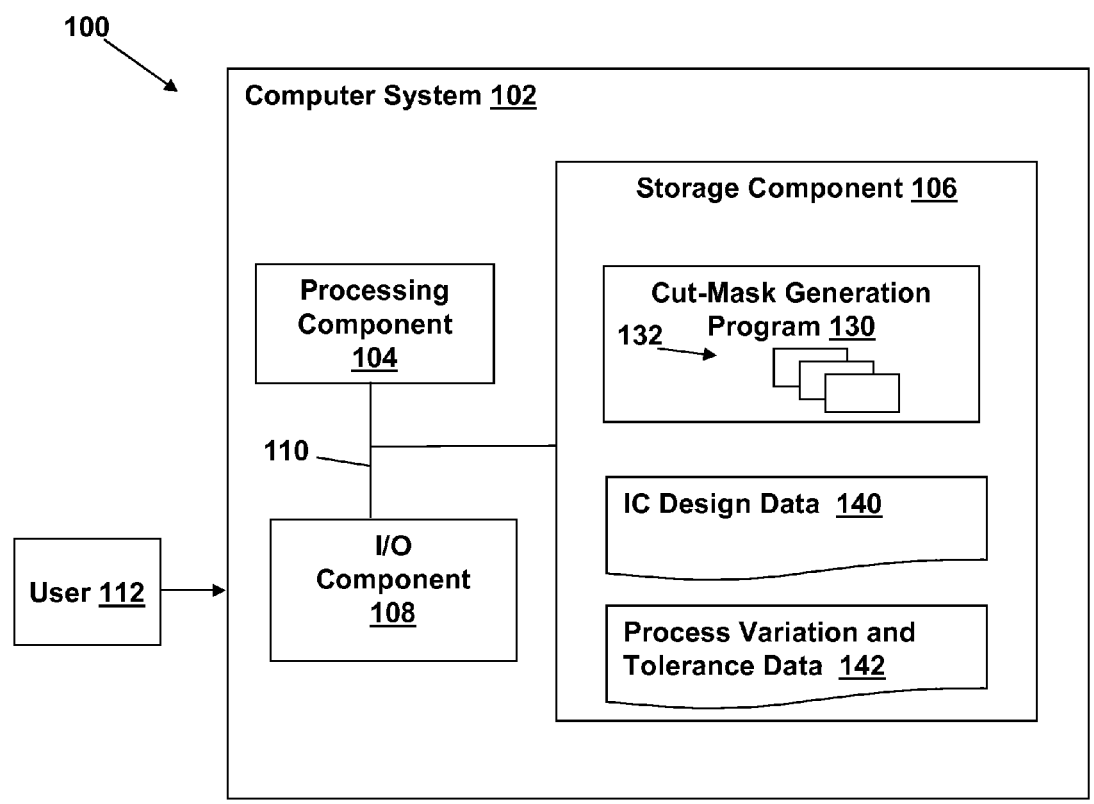
FIG. 12 depicts an illustrative environment 100 for generating a cut mask in an integrated circuit design according to embodiments.

Turning to FIG. 11, a flow diagram illustrating a method according to an embodiment is shown. In process P1, the first photomask patterning process is simulated using the integrated circuit design data 140, as well as process variation and tolerance data 142, generating simulated contours. It is understood that the process variation and tolerance data 142 may include one or more of: data representing process variation bands (P-V band data), and data representing tolerance bands. In process P2, the simulated contours from the first patterning process are compared to the desired target design. In process P3, regions (or, features) not common to the simulated contours and the desired design are identified as undesired or non-design regions. In process P4, using the identified regions (or, features), along with process variation and tolerance data 142, desired target shapes for the second photomask patterning process are created (where second photomask patterning process is subsequent to and dependent upon the first photomask patterning process). In process P5, the desired target shapes are provided to e.g., a mask design program or operator for the purpose of forming a second photomask design (or, cut mask design) based upon those desired target shapes (using, e.g., a mask data preparation technique known in the art).

It is understood that the aspects of the disclosure may apply to a plurality of mask levels in building an integrated circuit. For example, in one embodiment, solutions described herein may be used to design a cut mask for a poly-conductor level of an IC. In another embodiment, aspects of the disclosure may be used to design a cut mask for a metal level of a complementary metal oxide semiconductor (CMOS) device. Further it is understood that aspects of the invention may apply beyond any particular printing assist features and/or double-patterning scheme, and may apply to methods such as sidewall image transfer. Additionally, aspects of the invention should not be limited by particular mask type or photoresist tone configurations, as the teachings described herein may apply to a variety of mask types and photoresist tone configurations.

FIG. 8 depicts an illustrative environment 100 for generating a cut mask in an integrated circuit design according to an embodiment. To this extent, the environment 100 includes a computer system 102 that can perform a process described herein in order to generate a cut mask in an integrated circuit design. In particular, the computer system 102 is shown as including a cut mask generation program 130, which makes computer system 102 operable to handle cut mask generation for an integrated circuit design by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the cut mask generation program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the cut mask generation program 130 can manage a set of interfaces (e.g., graphical user interface(s), application program interface, etc.) that enable human and/or system users 112 to interact with the cut mask generation program 130. Further, the cut mask generation program 130 can manage (e.g., store, retrieve, create, manipulate, organize, present, etc.) data, such as integrated circuit (IC) design data 140, process variation and tolerance data 142, etc., using any solution.

In any event, the computer system 102 can comprise one or more general purpose computing articles of manufacture (e.g., computing devices) capable of executing program code, such as the cut mask generation program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the cut mask generation program 130 can be embodied as any combination of system software and/or application software.

Further, the cut mask generation program 130 can be implemented using a set of modules 132. In this case, a module 132 can enable the computer system 102 to perform a set of tasks used by the cut mask generation program 130, and can be separately developed and/or implemented apart from other portions of the cut mask generation program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of cut mask generation program 130 fixed thereon (e.g., one or more modules 132). However, it is understood that the computer system 102 and cut mask generation program 130 are only representative of various possible equivalent computer systems that may perform a process described herein. To this extent, in other embodiments, the functionality provided by the computer system 102 and cut mask generation program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC design data 140 and/or process variation and tolerance data 142 using any solution. For example, the computer system 102 can generate and/or be used to generate IC design data 140 and/or process variation and tolerance data 142, retrieve IC design data 140 and/or process variation and tolerance data 142, from one or more data stores, receive IC design data 140 and/or process variation and tolerance data 142, from another system, send IC design data 140 and/or process variation and tolerance data 142 to another system, etc.

While shown and described herein as a method and system for generating a cut mask for forming of an integrated circuit, it is understood that aspects of the invention further provide various alternative embodiments. For example, in one embodiment, the invention provides a computer program fixed in at least one computer-readable medium, which when executed, enables a computer system to generate a cut mask for forming of an integrated circuit. To this extent, the computer-readable medium includes program code, such as the cut mask generation program 130 (FIG. 8), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the cut mask generation program 130 (FIG. 8), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for generating a cut mask for forming of an integrated circuit. In this case, a computer system, such as the computer system 102 (FIG. 8), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of designing a photomask, performed using at least one computing device, the method comprising:
   simulating a first photomask patterning process using a first photomask design to create simulated contours, using the at least one computing device;
   comparing the simulated contours to a desired design;
   identifying regions not common to the simulated contours and the desired design;
   creating desired target shapes for a second photomask patterning process subsequent to the first photomask patterning process based upon the identified regions, using the at least one computing device; and
   providing the desired target shapes for forming of a second photomask design based upon the desired target shapes.

2. The method of claim 1, wherein the desired target shapes for the second photomask patterning process are created to remove at least one of extraneous features and additional features in the identified region during the second photomask patterning process, wherein the extraneous features include features predicted to print due to at least one of optical interference and sub-resolution assist features (SRAFs).

3. The method of claim 1, wherein the simulating of the first photomask patterning process includes simulating using nominal processing conditions.

4. The method of claim 3, wherein the simulated contours are formed according to the nominal process conditions.

5. The method of claim 1, wherein the simulating of the first photomask patterning process includes simulating using process variation conditions.

6. The method of claim 5, wherein the simulated contours are formed according to the process variation conditions to form a process variation band.

7. The method of claim 6, wherein the process variation band represents a range of possible edge locations printable within the process variation conditions.

8. The method of claim 6, wherein the comparing of the simulated contours to the desired design includes comparing the process variation band to tolerance bands associated with the desired target shapes for the second photomask patterning process.

9. A computer system comprising:
   at least one computing device configured to design a photomask by performing actions comprising:
   simulating a first photomask patterning process using a first photomask design to create simulated contours;
   comparing the simulated contours to a desired design;
   identifying regions not common to the simulated contours and the desired design;
   creating desired target shapes for a second photomask patterning process subsequent to the first photomask patterning process based upon the identified regions; and
   providing the desired target shapes for forming of a second photomask design based upon the desired target shapes.

10. The system of claim 9, wherein the simulating of the first photomask patterning process includes simulating using nominal processing conditions.

11. The system of claim 10, wherein the simulated contours are formed according to the nominal process conditions.

12. The system of claim 9, wherein the simulating of the first photomask patterning process includes simulating using process variation conditions.

13. The system of claim 12, wherein the simulated contours are formed according to the process variation conditions to form a simulated process variation band.

14. The system of claim 13, wherein the process variation band represents a range of possible edge locations printable within the process variation conditions.

15. The system of claim 13, wherein the comparing of the simulated contours to the desired design includes comparing the process variation band to tolerance bands associated with the desired target shapes for the second photomask patterning process.

16. A computer program product comprising program code embodied in at least one non-transitory computer-readable medium, which when executed, enables a computer system to implement a method for designing a photomask, the method comprising:
- simulating a first photomask patterning process using a first photomask design to create simulated contours;
- comparing the simulated contours to a desired design;
- identifying regions not common to the simulated contours and the desired design;
- creating desired target shapes for a second photomask patterning process subsequent to the first photomask patterning process based upon the identified regions; and
- providing the desired target shapes for forming of a second photomask design based upon the desired target shapes.

17. The computer program product of claim 16, wherein the desired target shapes for the second photomask patterning process are created to remove at least one of extraneous features and additional features in the identified region during the second photomask patterning process, wherein the extraneous features include features predicted to print due to at least one of optical interference and sub-resolution assist features (SRAFs).

18. The computer program product of claim 16, wherein the simulating of the first photomask patterning process includes simulating using nominal processing conditions.

19. The computer program product of claim 18, wherein the simulated contours are formed according to the nominal process conditions.

20. The computer program product of claim 16, wherein the simulating of the first photomask patterning process includes simulating using process variation conditions.

21. The computer program product of claim 20, wherein the simulated contours are formed according to the process variation conditions to form a simulated process variation band.

22. The computer program product of claim 21, wherein the process variation band represents a range of possible edge locations printable within the process variation conditions.

23. The computer program product of claim 21, wherein the comparing of the simulated contours to the desired design includes comparing the process variation band to tolerance bands associated with the desired target shapes for the second photomask patterning process.

24. A computer system comprising:
- at least one computing device configured to design a photomask by performing actions comprising:
  - simulating a first photomask patterning process using a first photomask design to create simulated contours, the first photomask design having target shapes including at least one of design features and additional features;
  - comparing the simulated contours to a desired design;
  - identifying regions not common to the simulated contours and the desired design;
  - creating desired target shapes for a second photomask patterning process subsequent to the first photomask patterning process based upon the identified regions, wherein the desired target shapes for the second photomask patterning process are created to remove at least one of extraneous features and additional features in the identified region during the second photomask patterning process, wherein the extraneous features include features predicted to print due to at least one of optical interference and sub-resolution assist features (SRAFs); and
  - providing the desired target shapes for forming of a second photomask design based upon the desired target shapes.

* * * * *